United States Patent
Horng et al.

(10) Patent No.: US 7,217,577 B2
(45) Date of Patent: May 15, 2007

(54) STRUCTURE/METHOD TO FABRICATE A HIGH-PERFORMANCE MAGNETIC TUNNELING JUNCTION MRAM

(75) Inventors: Cheng T. Horng, San Jose, CA (US); Mao-Min Chen, San Jose, CA (US); Liubo Hong, San Jose, CA (US); Ru-Ying Tong, San Jose, CA (US)

(73) Assignees: Headway Technologies, Inc., Milpitas, CA (US); Applied Spintronics, Inc., Milpitas, CA (US)

( * ) Notice: Subject to any disclaimer, the term of this patent is extended or adjusted under 35 U.S.C. 154(b) by 0 days.

(21) Appl. No.: 11/522,663

(22) Filed: Sep. 18, 2006

(65) Prior Publication Data

US 2007/0015294 A1 Jan. 18, 2007

Related U.S. Application Data

(62) Division of application No. 10/844,171, filed on May 12, 2004, now Pat. No. 7,122,852.

(51) Int. Cl.
*H01L 21/00* (2006.01)
(52) U.S. Cl. .................................. 438/3; 257/E21.665
(58) Field of Classification Search ............... 438/3; 257/E21.665
See application file for complete search history.

(56) References Cited

U.S. PATENT DOCUMENTS

| | | | |
|---|---|---|---|
| 6,114,719 A | 9/2000 | Dill et al. | |
| 6,544,801 B1 | 4/2003 | Slaughter et al. | |
| 6,703,654 B1 | 3/2004 | Horng et al. | |
| 6,960,480 B1 | 11/2005 | Horng et al. | |
| 6,974,708 B2 * | 12/2005 | Horng et al. | 438/3 |
| 2005/0170532 A1 | 8/2005 | Horng et al. | |

OTHER PUBLICATIONS

S. S. Parkin et al., "Exchange-biased Magnetic Tunnel Junctions and Application to Nonvolatile Magnetic Random Access Memory (Invited)", J. Appl. Phys., vol. 83, No. 8, pp. 5828-5833, Apr. 15, 1999.
S. Tehrami et al., "Progress and Outlook for MRAM Technology", IEEE Trans. on Magnetics, vol. 35, No. 5, pp. 2814-2819, Sep. 1999.
A. R. Sitaram, et al., "A 0.18μm Logic based MRAM Technology for High Performance Nonvolatile Memory Applications", Mar. 2003.
E. Nakashio et al., "Magnetoresistance of Co 100-x Fex/AL-Oxide/Co 100-x Fex Tunnel Junctions", IEEE Trans. on Magnetics, vol. 36, No. 5, Sep. 2000, pp. 2812-2814.

* cited by examiner

*Primary Examiner*—B. William Baumeister
*Assistant Examiner*—Igwe U. Anya
(74) *Attorney, Agent, or Firm*—Saile Ackerman LLC; Stephen B. Ackerman

(57) ABSTRACT

An MTJ (magnetic tunneling junction) MRAM (magnetic random access memory) cell is formed on a conducting lead and magnetic keeper layer that is capped by a sputter-etched Ta layer. The Ta capping layer has a smooth surface as a result of the sputter-etching and that smooth surface promotes the subsequent formation of a lower electrode (pinning/pinned layer) with smooth, flat layers and a radical oxidized (ROX) Al tunneling barrier layer which is ultra-thin, smooth, and to has a high breakdown voltage. A seed layer of NiCr is formed on the sputter-etched capping layer of Ta. The resulting device has generally improved performance characteristics in terms of its switching characteristics, GMR ratio and junction resistance.

12 Claims, 2 Drawing Sheets

STRUCTURE/METHOD TO FABRICATE A HIGH-PERFORMANCE MAGNETIC TUNNELING JUNCTION MRAM

This is a Divisional Application of U.S. patent application Ser. No. 10/844,171, filed on May 12, 2004 now U.S. Pat. No. 7,122,852, which is herein incorporated by reference in its entirety, and assigned to a common assignee.

RELATED PATENT APPLICATION

This application is related to Docket No. HT 02-019, Ser. No., 10/371841, filing date Feb. 20, 2003, to Docket No. HT 02-032, Ser. No., 10/768917, filing date Jan. 30, 2004 and to Docket No. HT 03-025/031, Ser. No. 10/849310, filing date May 19, 2004, assigned to the same assignee as the current invention.

BACKGROUND OF THE INVENTION

1. Field of the Invention

This invention relates generally to magnetic tunneling junction (MTJ) MRAMs and more particularly to the use of a simple fabrication process that leads to a smooth bottom electrode and superior performance properties.

2. Description of the Related Art

The magnetic tunneling junction device (MTJ device) is essentially a variable resistor in which the relative orientation of magnetic fields in an upper and lower magnetized electrode controls the flow of spin-polarized tunneling electrons through a very thin dielectric layer (the tunneling barrier layer) formed between those electrodes. As electrons pass through the lower electrode they are spin polarized by its magnetization direction. The probability of an electron tunneling through the intervening tunneling barrier layer then depends on the magnetization direction of the upper electrode. Because the tunneling probability is spin dependent, the current depends upon the relative orientation of the magnetizations of magnetic layers above and below the barrier layer. Most advantageously, one of the two magnetic layers (the pinned layer) in the MTJ has its magnetization fixed in direction, while the other layer (the free layer) has its magnetization free to move in response to an external stimulus. If the magnetization of the free layer is allowed to move continuously, as when it is acted on by a continuously varying external magnetic field, the device acts as a variable resistor and it can be used as a read-head. If the magnetization of the free layer is restricted to only two orientations relative to the fixed layer (parallel and anti-parallel), the first of which produces a low resistance (high tunneling probability) and the second of which produces a high resistance (low tunneling probability), then the device behaves as a switch, and it can be used for data storage and retrieval (a MRAM).

Magnetic tunneling junction devices are now being utilized as information storage elements in magnetic random access memories (MRAMs). Typically, when used as an information storage or memory device, a writing current orients the magnetization of the free layer so that it is either parallel (low resistance) or anti-parallel (high resistance) to the pinned layer. The low resistance state can be associated with a binary 0 and the high resistance state with a binary 1. At a later time a sensing current passed through the MTJ indicates if it is in a high or low resistance state, which is an indication of whether its magnetizations are, respectively, antiparallel or parallel and whether it is in a 0 or 1 state. Typically, switching the magnetization direction of the free layer from parallel to antiparallel and vice-versa is accomplished by supply currents to orthogonal conductor lines, one which is above the MRAM cell and one which is below it. The line below the cell is referred to as the word line and it is electrically isolated from the cell. The line above the cell, called the bit line, is in direct electrical contact with the cell and is used for both writing on the cell, ie changing the direction of the free layer magnetization and reading the cell, ie detecting the free layer magnetization direction. The two lines pass each other orthogonally, in separated vertical planes, with the cell lying between them. Thus their combined field peaks just above the switching threshold of the cell, the field required to cause a transition from parallel to antiparallel orientations of the free layer and pinned layer magnetizations.

For fast operation, the cell must have a high magnetoresistance ratio (DR/R), where DR represents the resistance variation when the free layer switches its magnetization direction and R represents the total minimum resistance of the cell. For stable operation, the cell's junction resistance, RA, where A is cell cross-sectional area, must be well controlled. When the MRAM device is used as the basic element of a memory, it is replicated to form an array of many such devices and integrated with associated CMOS circuitry which accesses particular elements for data storage and retrieval.

When fabricating an MRAM element or an array of such elements, the necessity of creating a high value of DR/R and maintaining a high degree of control over the junction resistance requires the formation of thin, smooth layers of high quality.

Slaughter et al. (U.S. Pat. No. 6,544,801 B1) teaches a method of fabricating such a magnetic tunneling device wherein the problem of interdiffusion between layers of different metals during high temperature annealing processes is significantly reduced. Such interdiffusion would adversely affect the properties of the various layers because of the tendency of the various metals to alloy with each other.

Dill et al. (U.S. Pat. No. 6,114,719) teaches a method of effectively biasing an MTJ device using biasing layers disposed within the device stack, so that its magnetic states are stable, yet there is not required the addition of adjacent magnetic structures which would adversely affect the high device density required for an MRAM array.

In a "standard process" MRAM array structure the MTJ stack (lower electrode/AlOx tunneling barrier/upper electrode) is deposited on top of the bottom conductor, which is typically a tri-layer such as Ta/Cu/Ta or NiCr/Ru/Ta. In the latter tri-layer, the Ta that caps the Ru is grown with an α-phase structure, in the former tri-layer, the Ta that caps the Cu is grown with a β-phase structure. Prior to depositing the MTJ stack it is necessary to sputter-etch the TaO which grows on the Ta capping layer. This sputter-etch not only removes the surface TaO, but the energetic Ar sputtering ions also alter the Ta surface structure. The resulting sputter-etched Ta surface appears to be "amorphous-like", similar to that of amorphous $Al_2O_3$. In our experiments we have found that an altered Ta surface is necessary for forming a flat, smooth bottom electrode on which to most advantageously form an oxidized Al tunneling barrier layer of high integrity. It was also noted by us that refilling the sputter-etched Ta surface by a Ta sputter-deposition actually results in a rougher surface structure of the bottom electrode. The integrity of the oxidized Al barrier layer is an essential element in fabricating a high quality MTJ device.

Formation of a high-speed MRAM array is quite complicated. Normally its word line structure is surrounded by a dielectric layer, so the line essentially lies within a cavity. This cavity has a back (or bottom) surface and two parallel side surfaces that are spaced apart. The back and/or side surfaces of the cavity are covered with an NiFe magnetic layer which acts as a field keeper (it contains the magnetic flux). The conducting portion of the line, surrounded by the magnetic keeper structure, is formed within the cavity. A polishing process is then used to remove any portion of the keeper or conducting portion of the line that extends above the level of the dielectric surface and to generally render that surface planar.

A novel MRAM array structure, not using the conducting lead structure of the standard process, has been developed in which the word line is constructed on top of the MTJ. The MRAM configuration of this novel array structure is:

NiCr50/NiFe100/NiCr30/Cu50/MnPt100/CoFe18/
Ru7.5/CoFe15/Al(8–10)/ROX/free/cap

The NiCr50/NiFe100/NiCr30/Cu50 portion is the bottom conducting lead (the numerals representing thicknesses in angstroms), which includes a NiCr 50 seed layer, a 100 angstrom NiFe soft adjacent keeper layer, a second NiCr 30 seed layer and a Cu 50 conducting layer; the MnPt100/CoFe18/Ru7.5/CoFe15 portion is the bottom electrode (a synthetic pinned structure), the Al(8–10)/ROX is a tunneling barrier layer formed by radical oxidation of an 8–10 angstrom thick Al layer and then there is the upper electrode, which includes a free layer and a capping layer formed thereon but not described here in detail. The entire stack is advantageously formed by magnetron sputtering in a single pump-down of the sputtering chamber.

In initial testing of this single pump-down fabrication, RA (junction resistance), DR/R and $V_b$ (breakdown voltage of the barrier layer) were found to be much lower than values obtained from the standard (prior art) process in which the patterned conductor lead and the MRAM stack are formed separately. Further, high resolution TEM analysis of the single pump-down layers showed that the bottom electrode layers had a columnar grain structure, which tended to create rough surfaces. In contrast, the surfaces of layers formed in the standard process were relatively smooth and flat. The essential difference in the two processes is that the standard process configuration includes a Ta capping layer that is sputter-etched.

The object of this invention is to modify the single pump-down process so that a smooth, flat layered structure (as in the standard process) is obtained while still maintaining the advantages of the single pump-down of the novel process.

SUMMARY OF THE INVENTION

A first object of this invention is to provide a method of forming an MTJ MRAM element and an array of such elements, that are characterized by smooth, flat layers in the bottom electrode and an ultra thin, smooth tunneling barrier layer with high breakdown voltage.

A second object of this invention is to provide such an MRAM element and MRAM element array that can be fabricated in a single pump-down process.

The objects of the present invention will be achieved by the fabrication of an MRAM element having the following novel configuration:

NiCr50NiFe100/NiCr30/Cu50/Ta80/Ru30/[SE
Ru30Ta(20–30)]/NiCr40/MnPt100/Co Fe18/
Ru7.5/CoFe15/Al(8–10)/ROX/free/cap Here, an initially deposited Ta80/Ru30 bilayer plays the role of a capping layer (the Ru protecting the Ta from oxidation) for the conducting lead layer of Cu50, and then it is sputter-etched (SE) to remove the Ru 30 and between approximately 20 and 30 angstroms of the Ta 80, leaving only 50 to 60 angstroms of the Ta prior to deposition of the NiCr40/MnPt100/CoFe18/Ru7.5/CoFe15 pinned bottom electrode layer.

MRAM devices manufactured as above have excellent characteristics. Prior to the above configuration, the single pump-down without the sputter-etched Ta capping layer produced values of RA, DR/R and $V_b$ that were respectively 0.4–0.8 k$\Omega$-$\mu$m$^2$, 10–15% and 1.0 volt. Using the new process, the values obtained are 3.0–4.0 k$\Omega$-$\mu$m$^2$, 38% and 1.6 volts. These values are comparable to those obtained in the prior multiple step process. In addition to these improved characteristic values, the MRAM device of the present invention also has excellent switching characteristics, with MR v. field curves showing simple rectangular shapes with no jumps or kinks in hysteresis loops. For a cell of 0.2×0.4 $\mu$m$^2$ cross-sectional area the switching current required is about 2 ma, compared to a switching current of about 5 ma for the conventional process elements.

DESCRIPTION OF THE PREFERRED EMBODIMENTS

The present invention is a method of forming an MTJ MRAM with a tunnel barrier layer of high integrity, in a single pump-down process, by the introduction of a sputter-etched Ta capping layer formed on the lower bit line. The sputter-etched Ta layer promotes the subsequent formation of smooth, flat layers within the bottom electrode and thereby allows the formation of a thin, smooth and flat tunnel barrier layer made by subjecting a thin Al layer to a process of radical oxidation (ROX).

Figure 1A:
FIG. 1a–FIG. 1e are schematic cross-sectional views of the formation of an MTJ MRAM device on a conducting lead layer using the method and configuration of the present invention.

Referring first to FIG. 1a, there is seen in a schematic cross section an initial stage of a preferred embodiment of the invention, the formation of a single MRAM element, which can be a part of an array of such elements. It is to be understood that in the embodiments to be disclosed in what follows, all layer depositions take place in a high vacuum system suitable for depositing thin layers by sputtering. In these embodiments the system was a commercially available Anelva 7100 system which includes ultra-high vacuum sputtering-deposition chambers and oxidation chambers, but other comparable systems are also suitable. It is also noted that in all the embodiments to be discussed, when the tunneling barrier layer was to be oxidized, the fabrication already formed (having the un-oxidized, as-deposited Al layer on it) was removed from the high vacuum system and placed in a separate oxidation chamber for the oxidation process to occur. Subsequent to the oxidation, the fabrication is replaced into the high vacuum sputtering chamber for the remaining layer depositions.

There is shown first a substrate (10), which in this embodiment is a dielectric layer formed on a silicon substrate. A lower conducting lead (the bit line), on which the MRAM element will be formed, is deposited on the substrate. This invention includes the formation of the bit line, which contains a soft magnetic keeper structure, on the substrate and the subsequent formation of the MRAM stack on the bit line. It is further understood that the single MRAM element to be described can be one of an array of such elements and that such element or array may be further connected to associated circuitry used in storing and retrieving information.

On the substrate (10), there is deposited a first seed layer (20), which in this embodiment is a layer of NiCr (35%–45%) formed to a thickness between approximately 50 and 100 angstroms, with approximately 50 angstroms being preferred. The percentages refer to percent of atoms of Cr in the NiCr alloy. On the seed layer is then formed a keeper layer (25) of soft magnetic material, which in this embodiment is a layer of NiFe formed to a thickness between approximately 50 and 200 angstroms with 100 angstroms being preferred. On the keeper layer there is formed a conducting lead layer (35) which can have two different structures. In one structure it includes a (third) seed layer (30), which is a layer of NiCr (40%) formed to a thickness between approximately 20 and 50 angstroms and which will serve as a seed layer for the subsequently deposited conductor layer. On the seed layer (30) there is then formed a layer of conducting material (40), which in this form is a layer of Cu of thickness between approximately 50 and 100 angstroms with 50 angstroms being preferred. In a second structure, there is first deposited a layer of Ta (30) of thickness between approximately 50 and 100 angstroms with 50 angstroms being preferred. On the Ta layer (30) there is then formed a layer of conducting material (40), which in this embodiment is a layer of Cu of thickness between approximately 50 and 100 angstroms with 50 angstroms being preferred.

On either structure of the conducting layer there is then formed a capping layer (50) of Ta, of thickness between approximately 50 and 100 angstroms with 80 angstroms being preferred. A layer of Ru (55), of thickness between approximately 20 and 40 angstroms with 30 angstroms being preferred is then formed on the Ta capping layer to protect it from oxidation.

Figure 1B:

Referring next to FIG. 1b, there is shown this Ta/Ru bilayer as then being sputter-etched to remove the Ru entirely and to remove between approximately 20 and 30 angstroms of the as-deposited Ta layer, now denoted (53). This sputter-etching interrupts the columnar grain growth of the Ta which, if not interrupted, would produce a rough surface and poor quality subsequent layer structure. Instead, the sputter-etched Ta has a smooth surface which is characteristic of amorphous material layers.

Figure 1C:
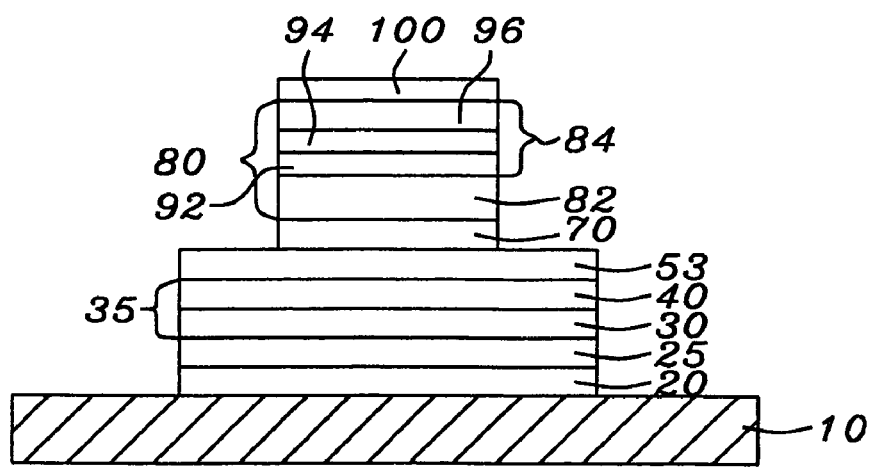

Referring now to FIG. 1c, there is shown the initial steps in the formation of the bottom electrode (the pinned layer) on the sputter-etched Ta capping layer. It is the feature of this invention that the layers of this electrode will be flat and smooth as a result of being formed on the sputter-etched Ta capping layer. First, a second seed layer (70), which in this embodiment is a layer of NiCr(40%) formed to a thickness between approximately 40 and 50 angstroms is formed on the sputter-etched Ta layer (53). A pinned/pinning layer (80) is then formed on the NiCr layer. The layer includes an antiferromagnetic pinning layer (82), which in this embodiment is a layer of MnPt formed to a thickness between approximately 100 and 200 angstroms, with approximately 150 angstroms being preferred. It is noted that a thinner layer of IrMn can be substituted for the MnPt if a thinner structure is required in order to produce a smaller spacing (and larger corresponding magnetic field) between the keeper layer and the free layer. On the pinning layer there is then formed a synthetic antiferromagnetic pinned (SyAP) layer (84), which in this embodiment is a first ferromagnetic layer (92) of CoFe of thickness between approximately 15 and 25 angstroms with 18 angstroms being preferred. On this layer is formed a thin coupling layer (94) of Ru, which is formed to a thickness between approximately 7 and 8 angstroms with 7.5 angstroms being preferred. On the coupling layer is formed a second ferromagnetic layer (96) of CoFe (25%) with a thickness between approximately 10 and 20 angstroms with 15 angstroms being preferred. The 25% by number of atoms of Fe in this layer of CoFe is found to produce a particularly good value of DR/R.

Still referring to FIG. 1c, there is shown the first step in the formation of a thin, flat and smooth tunneling barrier layer on the pinned layer in which an Al layer (100) between approximately 7 and 12 angstroms thickness with 10 angstroms being preferred is formed on the CoFe(25%) layer (96).

Figure 1D:
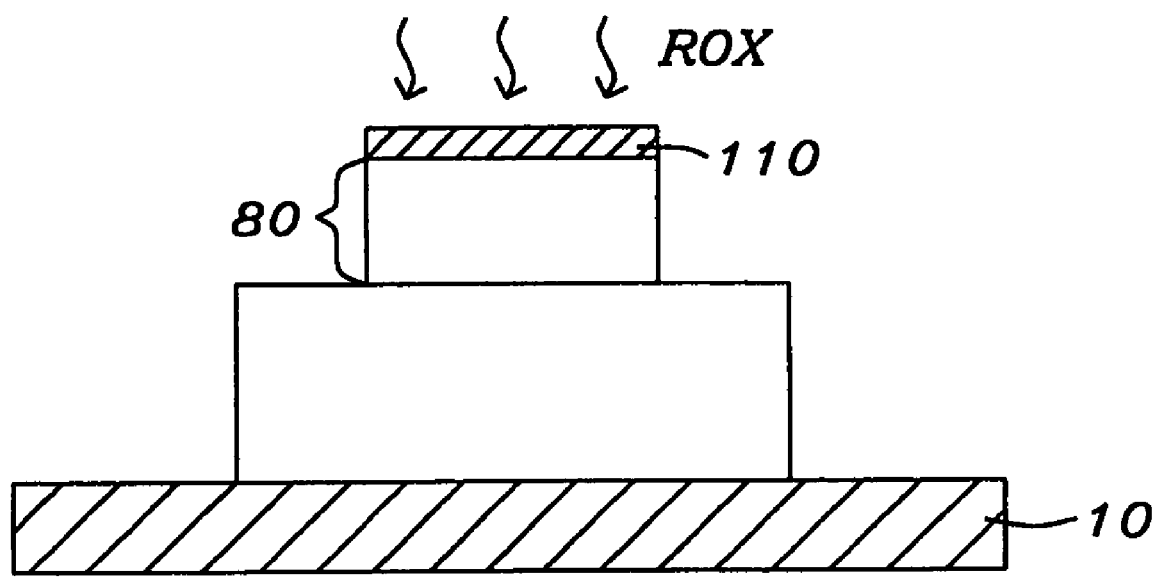

Referring now to FIG. 1d, there is shown the fabrication of FIG. 1c, with the as-deposited Al layer (100) thus far formed, removed from the high vacuum sputtering-deposition chamber and placed in an oxidation chamber where it is oxidized (shown schematically as arrows) by a process of radical oxidation (ROX) in-situ. The oxidized layer is now denoted as (110) and other layers and their numeric designation have been suppressed for clarity. The details of the oxidation chamber are not shown. Briefly, the ROX process as applied to achieve the objects of the present invention is a plasma oxidation process carried out within a plasma oxidation chamber wherein a grid-like cap is placed between an upper ionizing electrode and the wafer surface being oxidized. Oxygen gas is then fed to the upper electrode and power is supplied to the electrode to at least partially ionize the gas. Passage of the partially ionized gas through the cap produces a shower of oxygen atoms, molecules, radicals and ions and renders the various species produced by the electrode less energetic when they arrive at the wafer surface. Within the plasma chamber used herein, an upper electrode within the chamber is fed with 0.5 liters of oxygen gas to produce a shower of oxygen radicals. Power is supplied to the electrode at a rate of 500 to 800 watts. The tunneling barrier layer is thereby formed to exceptional smoothness and uniformity and has a high breakdown voltage, all being a result of its formation over the sputter-etched Ta and NiCr layers.

Figure 1E:
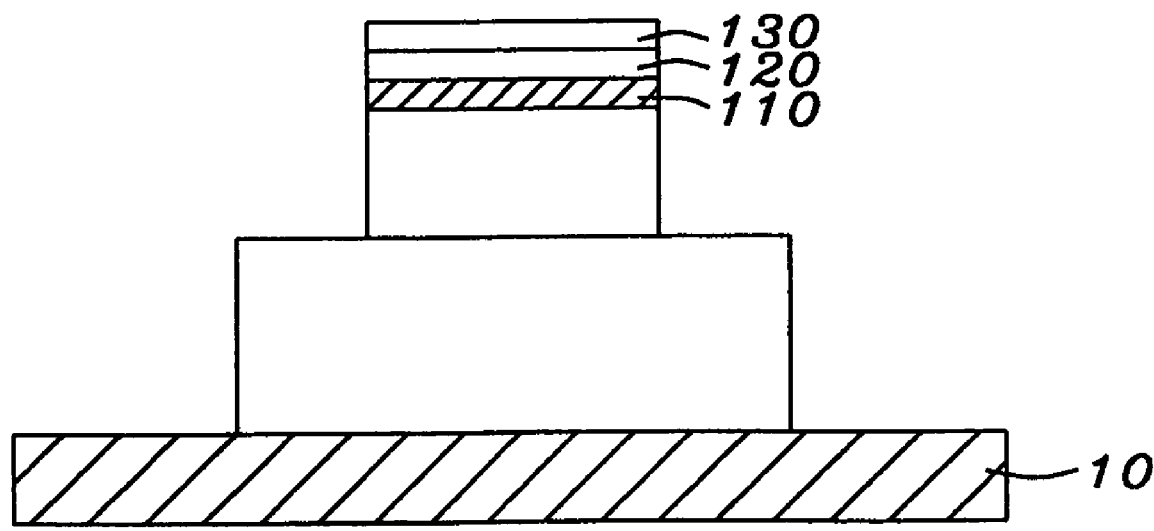

Referring next to FIG. 1e, there is shown the formation of free layer (120) on the bottom electrode. The free layer is preferably a layer of NiFe (18%) formed to a thickness between approximately 20 and 60 angstroms with 40 angstroms being preferred. It is found that NiFe with approximately 18% Fe by atom number used as the free layer gives particularly good switching characteristics. A capping layer (130) is formed on the free layer.

As is understood by a person skilled in the art, the preferred embodiments of the present invention are illustrative of the present invention rather than limiting of the present invention. Revisions and modifications may be made to methods, materials, structures and dimensions employed in forming and providing an MTJ MRAM device in which the lower electrode has a smooth and flat layer structure and the naturally oxidized tunneling barrier layer is thin, smooth and flat and has a high breakdown voltage as a result of all layers being formed on a sputter-etched Ta layer, while still forming and providing such a device and its method of formation in accord with the spirit and scope of the present invention as defined by the appended claims.

What is claimed is:

1. A method of forming a magnetic tunneling junction (MTJ) MRAM device with smooth and flat layers in its lower pinned electrode and a smooth tunneling barrier layer of high breakdown voltage comprising:

providing a substrate;

forming, in a high vacuum sputter-deposition chamber, a bottom magnetic keeper and conductor layer on said substrate, said formation process further comprising:

forming a first NiCr seed layer in said substrate;

forming a soft magnetic keeper layer on said seed layer;

forming a conducting lead layer on said keeper layer;

forming a first Ta layer as a capping layer on said conducting lead layer;

forming a Ru layer on said Ta capping layer; and completely removing said Ru layer by sputter-etching; and partially sputter-etching said Ta capping layer;

forming, in the same high vacuum sputter-deposition chamber a lower pinned electrode, said formation further comprising:

forming a second NiCr seed layer on said sputter-etched Ta capping layer;

forming, an AFM pinning layer on said seed layer;

forming a synthetic antiferromagnetic pinned (SyAP) layer on said pinning layer;

forming a tunneling barrier layer on said lower electrode, said formation further comprising:

forming, in said high vacuum sputter-deposition chamber a layer of Al on said SyAP layer;

oxidizing, in an oxidation chamber, said Al layer by an in-situ process of radical oxidation, said oxidized layer of Al to form a tunneling barrier layer on said pinned layer, said tunneling barrier layer being smooth and having a high breakdown voltage; and forming, in said high vacuum sputter-deposition chamber a free layer on said tunneling barrier layer; then forming, in said high vacuum sputter-deposition chamber an upper capping layer on said free layer.

2. The method of claim 1 wherein said first and second NiCr seed layers are formed of NiCr having 35%–45% Cr by number of atoms.

3. The method of claim 1 wherein said soft magnetic keeper layer is a layer of NiFe formed to a thickness between approximately 50 and 200 angstroms.

4. The method of claim 1 wherein the formation of said conducting lead layer comprises the formation of a third NiCr layer having approximately 35%–45% Cr by number of atoms and between approximately 40 and 60 angstroms in thickness on which is formed a layer of Cu to a thickness between approximately 50 and 100 angstroms.

5. The method of claim 1 wherein the formation of said conducting lead layer comprises the formation of a second layer of Ta approximately 50 angstroms in thickness on which is formed a layer of Cu to a thickness between approximately 50 and 100 angstroms.

6. The method of claim 1 wherein said layer of Ru is formed to an initial thickness of approximately 30 angstroms.

7. The method of claim 1 wherein said capping layer of Ta is formed to an initial thickness between approximately 50 and 100 angstroms and is sputter-etched to remove between approximately 20 and 30 angstroms of its thickness and to render its surface smooth and amorphous.

8. The method of claim 1 wherein said antiferromagnetic pinning layer is formed as a layer of MnPt to a thickness between 100 and 200 angstroms or a layer of IrMn formed to a thickness between approximately 50 and 100 angstroms.

9. The method of claim 1 wherein said SyAP layer is formed as a first and second layer of CoFe separated by a second layer of Ru and wherein at least the second CoFe layer, which is adjacent to said tunnel barrier layer, is CoFe(25%).

10. The method of claim 9 wherein said first CoFe layer is between approximately 15 and 25 angstroms in thickness, said second CoFe layer is between approximately 12 and 20 in thickness and said second Ru layer is between 7 and 8 angstroms thick.

11. The method of claim 1 wherein the process of radical oxidation of said Al layer further comprises placing the Al layer into a plasma oxidation chamber including, an upper electrode, a lower electrode and a grid positioned between said electrodes, placing said Al layer in contact with the lower electrode, feeding the upper electrode within the chamber with 0.5 liters of oxygen gas while providing power to the upper electrode at a rate of between 500 and 800 watts to produce a shower of oxygen radicals through said grid which impinge on said Al layer.

12. The method of claim 1 wherein said ferromagnetic free layer is formed as a layer of NiFe(18%) between approximately 30 and 60 angstroms thick.

* * * * *